(12) United States Patent
Panaghe et al.

(10) Patent No.: US 6,459,031 B1
(45) Date of Patent: Oct. 1, 2002

(54) THERMOELECTRIC COMPOSITIONS

(75) Inventors: Stylianos Panaghe, Knutsford (GB); Arsen Hakhoumian, Ashtarak (AM)

(73) Assignee: Spire Holdings Limited (GB)

( * ) Notice: Subject to any disclaimer, the term of this patent is extended or adjusted under 35 U.S.C. 154(b) by 0 days.

(21) Appl. No.: 09/500,659

(22) Filed: Feb. 8, 2000

(30) Foreign Application Priority Data

Aug. 8, 1997 (GB) ............................................. 9716718

(51) Int. Cl.$^7$ ............................................. H01L 35/12
(52) U.S. Cl. .................................................. 136/236.1
(58) Field of Search ...................................... 136/236.1

(56) References Cited

FOREIGN PATENT DOCUMENTS

| DE | 4306497 | * | 7/1993 |
| DE | 4434904 | * | 6/1996 |
| WO | WO-9001806 | * | 2/1990 |

OTHER PUBLICATIONS

Goncalves, A. P., Santos, I. C., Lopes, E. B. Henriques, R. T., and Almeida, M., Transport Properties of the Oxides $Y_{1-x}Ba_2Cu_3O_{7-\delta}$ ($0 \leq x \geq 1$): Effects of Band Filling and Lattice Distortion on Superconductivity, Physical Review B, vol. 37, No. 13, May 1, 1988, pp. 7476–7481.*

Macklin, W. J., and Moseley, P. T., "On the Use of Oxides for Thermoelectric Refrigeration", Materials Science and Engineering B, vol. 37, No. 1, Sep. 1, 1990, pp. 111–117.*

* cited by examiner

*Primary Examiner*—Bruce F. Bell
*Assistant Examiner*—Thomas H. Parsons
(74) *Attorney, Agent, or Firm*—Wallenstein & Wagner, Ltd.

(57) ABSTRACT

A composition is disclosed having the formula: $(RBa_2Cu_3O_{7-\delta})_x + (PrBa_2Cu_3O_{7-\delta})_{1-x}$ wherein: R comprises Y, Ce, Nd, Pm, Sm, Eu, Gd, Tb, Dy, Ho, Er, Tm, Yb, and/or Lu; $0 < x \leq 1$; and $\delta$ is such that the R $Ba_2Cu_3O_{7-\delta}$ component of the composition is in a metallic or transitional phase.

12 Claims, 2 Drawing Sheets

THERMOELECTRIC COMPOSITIONS

FIELD OF THE INVENTION

This invention relates to compositions for use as thermoelectric cooling and power generation elements and to methods for their preparation.

BACKGROUND OF THE INVENTION

The field of thermoelectric cooling is an important one, having obvious commercial applications, such as in refrigerators. Semiconductor devices, which utilise the Peltier effect, are known, the primary example being Bi Te based devices Such devices, which are in widespread commercial use, employ suitably doped Bi Te alloys as both p and n type semiconductor elements. Sb and/or Se may be used as additives in order to modify the physical (primarily thermal) characteristics of the elements.

The efficiency of such thermoelectric cooling devices (i.e. the heat absorbed per unit of consumed power) is generally represented by a figure of merit or performance factor Z, which is given by:

$$Z = \frac{S^2 \sigma}{\kappa}$$

where S is the thermopower coefficient or Seebeck voltage (V/°C.), $\sigma$ is the electrical conductivity ($\Omega^{-1}$ cm$^{-1}$) and $\kappa$ is the thermal conductivity (W cm$^{-2}$ or °C. cm$^{-1}$).

It is generally accepted that with the Bi Te based systems further improvements in Z are unlikely. Thus, there is a need to provide new materials having improved values of Z. U.S. Pat. No. 5,275,001 describes alternative materials for thermoelectric cooling which are based around various complex Sr Ti oxides. These materials are n type semiconductors.

The present invention addresses the abovementioned need by providing thermoelectric cooling elements having p type semiconductors exhibiting high values of Z. Furthermore, the present invention provides methods and strategies which enable the figure of merit Z to be optimized, by optimizing the combination of thermopower and electrical conductivity.

Goncalves et al (A P Goncalves, I C Santos, E B Lopes, R T Henriques, M Almeida and M O Figueiredo, Phys. Rev. B 37 (1988) 7476) disclose compositions of the general formula $Y_{1-x}Pr_xBa_2Cu_3O_{7-\delta}$, where $0 \leq x \leq 1$. Measurements of thermopower and resistivity are made, for the purpose of explaining the presence—or absence—of superconductivity in these materials. Furthermore, the precise oxygen deficiencies $\delta$ of the reported compositions are not established. Further still, the distribution of Y and Pr with the composition is homogeneous.

BRIEF SUMMARY OF THE INVENTION

Macklin and Moseley (W J Macklin and P T Moseley, Materials Science and Engineering B7 (1990) 111) described the thermoelectric data available at the time concerning a number of complex copper oxides, and commented generally upon the prospects of using such oxides in thermoelectric applications.

It is well known that it is possible to generate electrical power by "reversing" the above described process, i.e., by applying heat to materials of the type described above it is possible to generate electrical power.

According to a first aspect of the invention, there is provided a composition described by the formula $$(RBa_2Cu_3O_{7-\delta})_x + (PrBa_2Cu_3O_{7-\delta})_{1-x}$$

wherein

R comprises Y, Ce, Nd, Pm, Sm, Eu, Gd, Tb, Dy, Ho, Er, Tm, Yb, and/or Lu;

$0 < x \leq 1$; and $\delta$ is such that the $RBa_2Cu_3O_{7-\delta}$ component of the composition is in a metallic phase.

Compositions as defined above may be used as thermoelectric cooling elements. These mixed oxide compositions exhibit large values of Z, since the presence of the Pr oxide (which is a semiconductor irrespective of the oxygen deficiency) results in a high thermopower value, whilst the presence of the Y oxide in a metallic phase results in high values of electrical conductivity.

Preferably, x is less than 0.4, most preferably x is in the range $0.10 \leq x \leq 0.25$.

The invention also provides thermoelectric cooling devices in which at least one cooling element comprises a composition as defined above, and thermoelectric power generation devices in which at least one power generation element comprises a composition as defined above.

According to a second aspect of the invention, there is provided the use of a composition described by the formula $$RBa_2Cu_3O_{7-\delta}$$

wherein:

R comprises Y, Ce, Nd, Pm, Sm, Eu, Gd, Tb, Dy, Ho, Er, Tm, Yb, and/or Lu $\delta$ is such that the composition is in a transitional state between semiconducting and metallic phases; as a thermolectric cooling element or a thermoelectric power generation element.

Oxygen deficiencies corresponding to the phase transition from metallic to semiconductor behaviour (with a corresponding transition from orthorhombic to tetragonal lattice structures)—result in an optimal combination of electrical conductivity and thermopower.

The composition may be $YBa_2Cu_3O_{7-\delta}$, $Eu\ Ba_2Cu_3O_{7-\delta}$ or $SmBa_2Cu_3O_{7-\delta}$.

The invention also provides a thermoelectric cooling device in which at least one cooling element comprises a composition as defined with regard to this second aspect of the invention, and a thermoelectric power generation device in which at least one power generation element comprises a composition as defined with regard to this second aspect of the invention.

According to a third aspect of the invention, there is provided a method for preparing compositions as previously defined, the method comprising cooling of the composition by quenching.

The quenching may comprise quenching of the composition on a alumina plate, a copper plate or in liquid nitrogen.

According to a fourth aspect of the invention, there is provided a method for preparing compositions as previously defined, the method comprising the step of sintering granules of a predetermined range of grain sizes. The predetermined grain sizes may be in the range 0.1 to 100 $\mu$m, preferably 0.1 to 30 $\mu$m, most preferably 0.1 to 2 $\mu$m. This fourth aspect of the invention may also include the third aspect of the invention.

According to a fifth aspect of the invention, there is provided a method for preparing compositions as previously defined in which ultrasonic treatment is employed.

According to a sixth aspect of the invention, there is provided a thermoelectric cooling device in which at least one cooling element comprises a thin film semiconductor material, or a thermoelectric power generation device in which at least one power generation element comprises a thin film semiconductor material.

The films are convenient to prepare and provide easily controllable and uniform ceramic structures. Furthermore, it is possible to provide films having highly anisotropic electrical properties and pre-defined grain size and structure, thereby permitting optimization of the figure of merit. Still further, the heat generated by thermocooling is efficiently dissipated from thin films because of the inherently high surface area to volume ratios.

Preferably, the thickness of the film is less than 5 $\mu$m, most preferably less than 1 $\mu$m.

The semiconductor material may comprise a composition as previously defined in respect of the other aspects of the invention.

The semiconductor material may be texturised.

BRIEF DESCRIPTION OF THE DRAWINGS

Embodiments of compositions and methods according to the invention will now be described with reference to the accompanying drawings, in which.

DETAILED DESCRIPTION OF THE INVENTION

Figure 1:
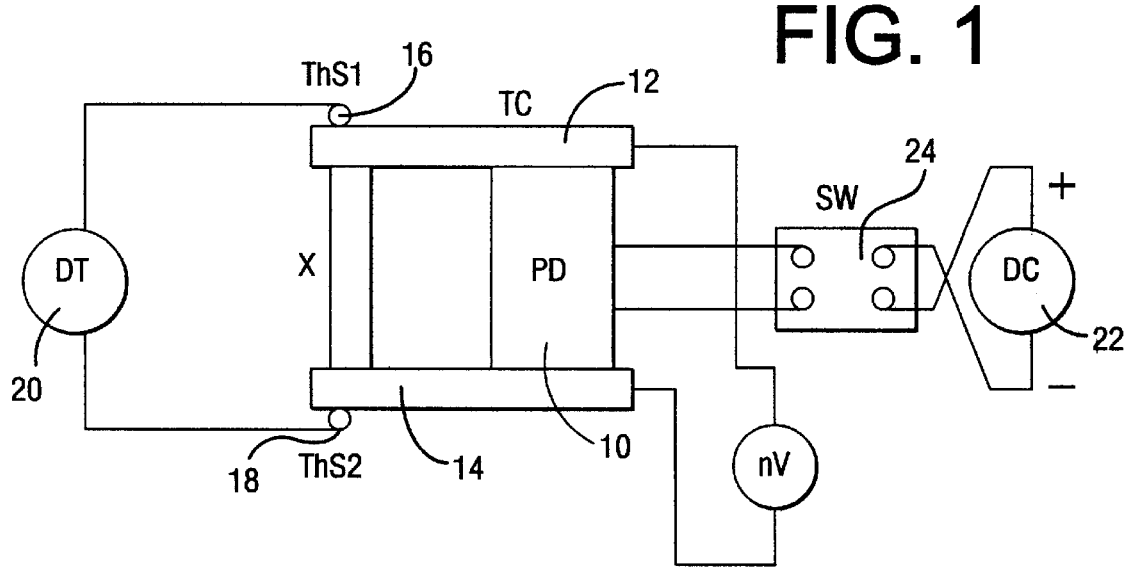
FIG. 1 is a schematic diagram of apparatus for measuring thermopower.

One aspect of the present invention is a composition described by the formula

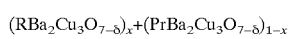

wherein:

R comprises Y, Ce, Nd, Pm, Sm, Eu, Gd, Tb, Dy, Ho, Er, Tm, Yb, and/or Lu;

$0 < x \leq 1$; and $\delta$ is such that the $RBa_2Cu_3O_{7-\delta}$ component of the composition is in a metallic phase.

Such materials are particularly promising as cooling elements in thermoelectric devices, because it is possible to produce very large values of Z by independently controlling thermopower and electrical conductivity. Both oxide components of the composition—$RBa_2Cu_3O_{7-\delta}$ and $PrBa_2Cu_3O_{7-\delta}$—adopt a distorted Perovskite lattice structure. The tetravalent Pr is present as an oxide which acts as a semiconductor for all values of $\delta$, and as such exhibits large thermopower but relatively poor electrical conductivity. However, the properties of the R oxide vary as a function of $\delta$. At room temperature, high oxygen deficiencies (approximately $0.75 < \delta \leq 1$ for the Y oxide) result in a pseudotetragonal lattice structure exhibiting properties characteristic of a semiconductor, i.e. large thermopower and relatively poor electrical conductivity. With increasing oxygen content (approximately $0.5 < \delta < 0.7$ for the Y oxide) there is a transition from a tetragonal to an orthorhombic structure. At low oxygen deficiencies (approximately $0 \leq \delta \leq 0.5$ for the Y oxide) the R oxide is metallic in behaviour, exhibiting large electrical conductivities but poor thermopowers.

The mixed oxide composition of the type described above is characterised (i) by a low oxygen deficiency, with the consequence that the R oxide component is present in a "metallic" phase. The Pr oxide component is present in a semiconductor phase even at low oxygen deficiency. Furthermore, (ii) the composition is not homogeneous, as it contains distinct granules of the Pr oxide and the R oxide. As a result, the mixed oxide composition exhibits both a large thermopower (from the Pr oxide component) and high electrical conductivity (from the R oxide), producing a very large value of Z. In effect, a material having a large value of Z is produced by independently controlling thermopower S and electrical conductivity $\sigma$.

The ratio of R to Pr is defined by the variable x. Preferably, x is less than 0.4, most preferably x is in the range 0.10 to 0.25, i.e. close to the percolation value. For $YBa_2Cu_3O_{7-\delta}$, the percolation value is ca. 0.17.

The manufacture of thermoelectric cooling elements from suitable semiconducting material is well-known in the art—details can be found, for example in U.S. Pat. No. 5,275,001. It will be apparent to the skilled reader that the compositions described herein may also be used as thermoelectric power generation elements, in which electrical power is produced from heat applied to the element.

It is noted that Gonçalves et al discloses the mixed oxide $Y_{1-x}Pr_x Ba_2Cu_3O_{7-\delta}$ ($0 \leq x \leq 1$). However, the precise oxygen deficiencies of the prepared mixed oxide materials are not discussed or determined. Macklin and Moseley refer to Gonçalves el al in their speculative discussion of possible uses of copper oxides in thermoelectric cooling. However, this article does little more than précis the reported measurements of resistivity and thermopower: no teaching is provided on optimal oxygen deficiencies, and, indeed, it is not suggested that the compositions of Gonçlaves et al would be suitable as thermoelectric elements.

Furthermore, and very importantly, the Y and Pr component are homogeneously distributed within the composition of Gonçlaves et al. In the present invention, the material is a composite comprising granules of $RBa_2Cu_3O_{7-\delta}$ and granules of $PrBa_2Cu_3O_{7-\delta}$. This permits control of factors such as grain boundary density which, as discussed in more detail below, have profound effects on S and $\sigma$.

$(RBa_2Cu_3O_{7-\delta})_x + (PrBa_2Cu_3O_{7-\delta})_{1-x}$ may be prepared by solid state reaction of R $Ba_2Cu_3O_{7-\delta}$ and $PrBa_2Cu_3O_{7-\delta}$, the amounts of these compounds used being calculated such that the correct value of x results. The individual R and Pr oxides are prepared by known means (see, for example, Gonclaves et al and references therein, the references of Mackin and Moseley and the preparations devised herein). The oxides are ground, preferably to a grain size less than 1 to 2 $\mu$m, mixed and pressed into pellet form. The pellet is heated at ca. 920° C. for ca. 10 hours, and then slowly cooled. It is important that "chemical" reaction does not occur—i.e, the distribution of R and Pr remains non-homogeneous.

Another aspect of the invention is the use of a single phase composition described by the formula

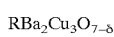

wherein:

R comprises Y, Ce, Nd, Pm, Sm, Eu, Gd, Tb, Dy, Ho, Er, Tm, Yb, and/or Lu;

and $\delta$ is such that the composition is in a transitional state between semiconducting and metallic phases; as a thermoelectric cooling element or a thermoelectric power generation element.

As discussed above, the properties of these compositions are dependent on the oxygen deficiency. Using YBa$_2$Cu$_3$O$_{7-\delta}$ as an example, when $0.7<\delta\leq1$, the composition behaves as a semiconductor, with the consequence that the electrical conductivity is too low for a significant value of Z to be achieved. When $0\leq\delta\leq0.5$, these compositions exhibit metallic behaviour, and the electrical resistivity increases more rapidly than the Seebeck voltage, with the consequence that an insufficiently large value of Z is obtained. In the oxygen deficiency range $0.5\leq\delta\leq0.7$ there is orthorhombic to tetragonal phase transition with an associated transition from metallic to semiconductor type behaviour. In this transition range, the thermopower and electrical conductivites are such that large values of Z may be obtained.

The distorted Perovskite metal oxide compositions RBa$_2$Cu$_3$O$_{7-\delta}$ are extremely well known as high temperature superconductors, with the consequence that the main thrust of the literature concerning these materials has focussed on properties contributing to the understanding of the observed superconductivities. Macklin and Moseley reviewed the available thermoelectric data on such complex copper oxides and concluded that the figures of merit associated with these materials were too low for commercialisation as thermoelectric elements. Macklin and Moseley tentatively suggested that improvements in the figure of merit might be achieved by varying the oxygen stoichiometry and doping levels. However, Macklin and Moseley disclose no strategy or rationale regarding the attainment of such improvements: indeed, the use of samples having a very high oxygen deficiency is implied.

Furthermore, as described in more detail below, the present invention provides methods and strategies which enable the figure of merit Z to be optimised. Such methods and strategies are a result of careful consideration of sample preparation conditions, and of the factors which affect electropower and electrical conductivities

EXAMPLE 1

Three groups of samples of EuBa$_2$Cu$_3$O$_{7-\delta}$ and SmBa$_2$Cu$_3$O$_{7-\delta}$ were prepared by solid state reaction.

Group "A" was prepared from powders of Eu$_2$/O$_3$/Sm$_2$O$_3$, Ba CO$_3$ and CuO, these powders being mixed and ground, and then sintered for 20 hours at 900° C. The resultant composition was reground and pressed into pellets, which were then sintered at 920° C. for 10 hours.

Group "B" was prepared from identical reagents to group "A", the preparation now comprising two cycles of mixing, grinding, re-grinding and sintering for 10 hours at 900° C. The resulting composition was pressed into pellet form, and then sintered at 920° C. for 30 hours Group "C" samples were prepared by further treatment of group "B" samples, this treatment comprising re-grinding, screening grains between 20 and 100 μm, pressing them into pellets and sintering at 920° C. for 20 hours.

A variety of cooling techniques were employed, namely natural furnace cooling, and quenching on a aluminia plate, on a copper plate and in liquid nirogen.

Resistances were measured by a standard four-probe method. Thermopower was measured using the differential method against lead. The apparatus for performing the thermopower measurements is shown in FIG. 1, and comprises the peltier device 10, thermocouples 12, 14, and temperature sensors 16, 18 connected to a differential thermometer 20 thereby providing the temperature differential between the warm and the cold side. The apparatus further comprises a direct current source 22 and current switching means 24, the latter permitting measurement of the thermopower at either polarity of the applied current.

Table 1 shows room temperature resistivities and absolute Seebeck voltage, obtained thereby, together with a quantity of $$Z^* = \frac{S^2}{\rho},$$

where Z* is a "partial" figure of merit, S is the Seebeck voltage and ρ the resistivity. It should be noted that calculation of a complete figure of merit Z, requires a knowledge of the thermal conductivity, κ; However, κ does not greatly depend on the rare earth metal present or the oxygen deficiency, it being typically in the range 2 to 4 Wm$^{-1}$ K$^{-1}$ Table 1 demonstrates that: i) huge improvements in Z* are possible if preparation conditions are correctly selected and ii) resistivity varies much more strongly with preparation conditions than thermopower. This is because conductivity (resistivity) is mainly determined by weak inter-granular media links, whilst thermopower is determined by granular conditions. Therefore, it is possible to almost independently control the conductivity and thermopower in these ceramic semiconductors.

Figure 2:
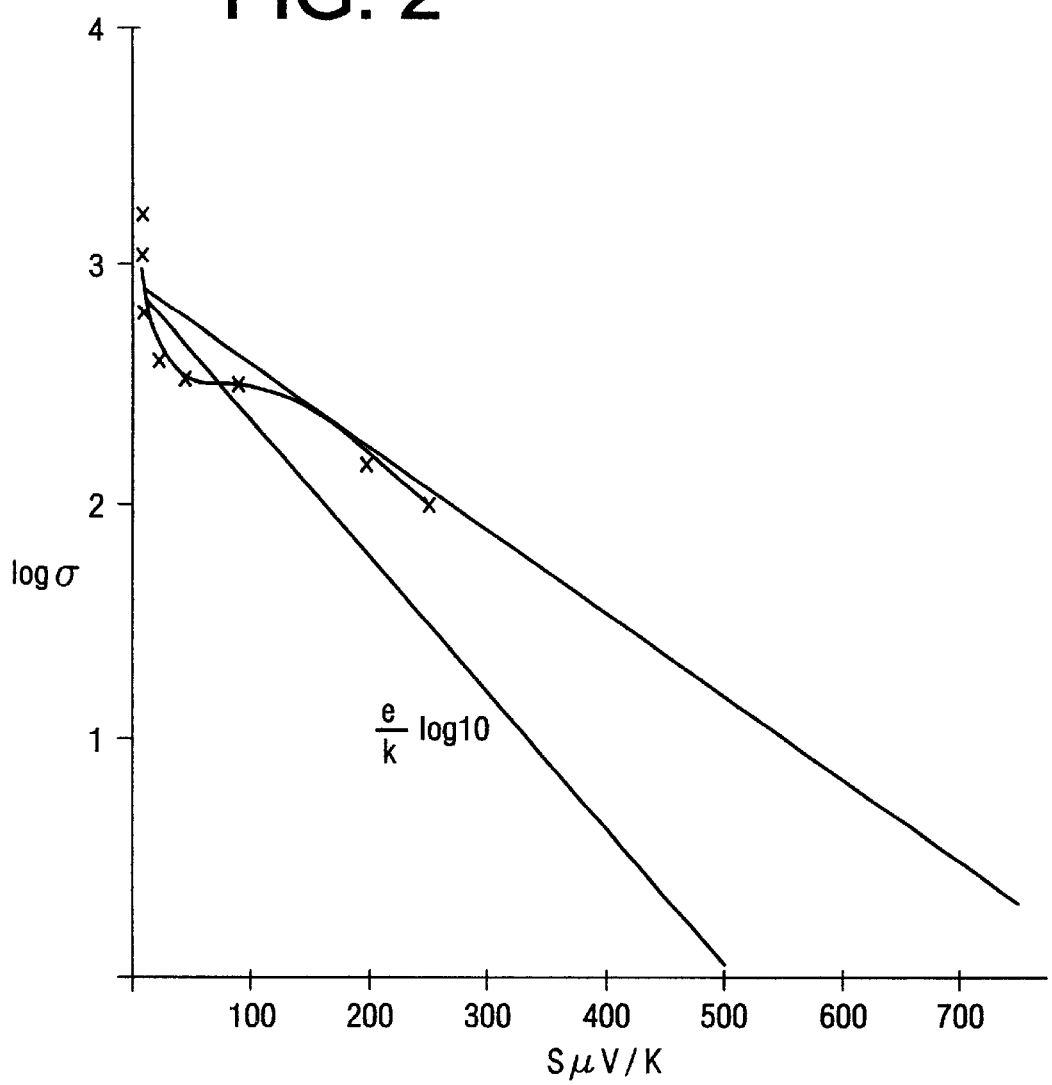
FIG. 2 shows log $\sigma$ against $S/(\mu V)K^{-1}$ for a number of ceramics.

FIG. 2 shows the results of precision measurements of conductivity and Seebeck voltage against oxygen deficiency in a ceramic of high quality. The data are not explained by the simple thermoactivation mechanism (shown on the line 1 g (e/k) in FIG. 2) which describes usual semiconductor behaviour. This indicates that other mechanisms—probably a hopping mechanism—are operating. The deviation from thermoactivation type behaviour corresponds to the transition region between semiconducting to metallic behaviour.

Another factor influencing Z is the existence of anisotropic resistivities in samples from group "C", where $\rho\|=1.45\times10^{-4}$ Ωcm, whilst $\rho\perp=1.25\times10^{-3}$ Ωcm, $\rho\|$ and $\rho\perp$ representing the resistivities parallel and perpendicular to the pressure axis, respectively. Upon regrinding samples from group "B", the granules were found to be monocrystals with highly anisotropic resistivities ($\rho_{ab}/\rho_c\sim100$–1000). After screening, the larger sized granules were uniaxially compressed into a pellet which exhibited anisotropy. Similar results were obtained for a Bi Te ceramic after sintering from small monocrystals.

EXAMPLE 2

Thin films of three types of YBa$_2$Cu$_3$O$_{7-\delta}$ were prepared, namely single crystalline, texturised and polycrystalline (non-oriented).

Figure 3:
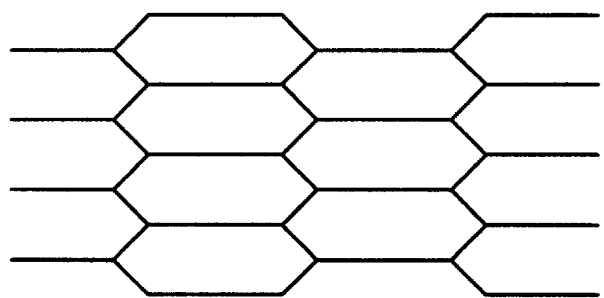
FIG. 3 shows grain structure in a monocrystalline film of $YBa_2Cu_3O_{7-\delta}$.
Figure 4:
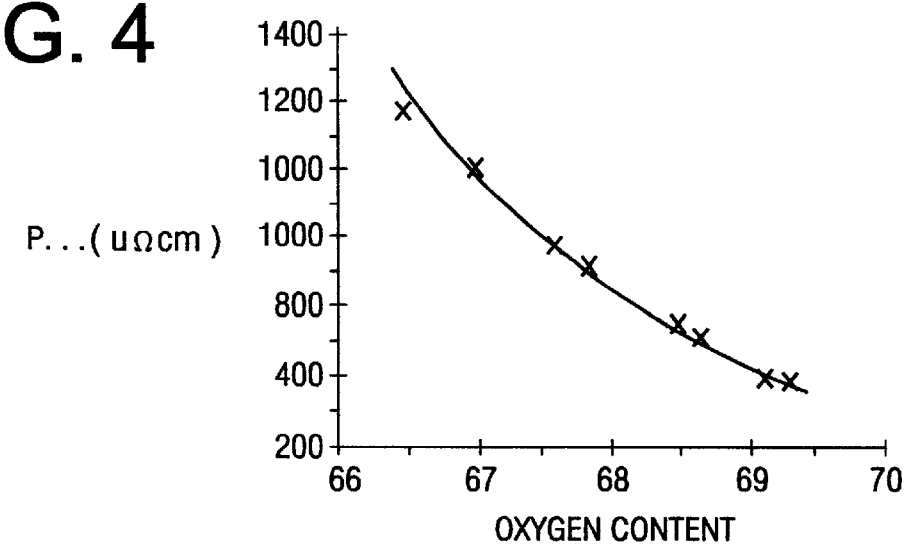
FIG. 4 shows $\rho/\mu\Omega$ cm against oxygen content for a number of thin film samples of $YBa_2Cu_3O_{7-\delta}$.

The monocrystalline thin films were deposited onto a single crystal plane (100) of LaAlO substrates by a rf magnetron sputtering method, producing a film thickness of about 0.5 to 0.6 μm. The surface of these films was interrogated by optical scanning microscopy (SEM), which revealed that the films consist of large (ca. 200 μm) longitudinally regular grains (see FIG. 3). Samples of YBa$_2$Cu$_3$O$_{6.93}$ yielded a resistivity ρ of 300 μΩcm. a superconducting transition temperature, T$_{co}$, of 93K, with a transition width ΔT$_{co}$ of 0.2K, and a crtical current density Jc (77K) of 1.6×10$^7$ Acm$^{-2}$ For quenched samples, FIG. 4 shows ρ vs oxygen content. These values are obtained indirectly from the relationships between T$_{co}$ and δ, and ρ and T$_{co}$.

Texturised polycrystalline films of YBa$_2$Cu$_3$O$_{7-\delta}$ were grown on Yttrium stabilised ZrO$_2$ substrates by pulsed laser deposition from pellets of the same stoichiometry. Films of thickness 0.3 μm were produced using the (100) plane of the substrate for deposition thereon. Non-oriented films were produced by a similar process using non-oriented substrate surfaces. SEM morphological analysis revealed the presence of irregularly shaped grains of size 2 to 3 μm. In the texturised films of prevalance of c axis oriented grains was observed. The following typical parameters were observed: for texturised films, $\rho(300K)=0.9$ m $\Omega$cm; $T_{co}=91K$; $\Delta T_{co}=2K$; $Jc=10^6$ Acm$^{-2}$; for non-oriented polycrystalline films, $\rho(300K)=2.4$ m $\Omega$cm; $T_{co}=81K$; $\Delta T_{co}=10K$; $Jc=10^5$ Acm$^{-2}$.

Resistivities were measured using a four probe method. Contacts were made by firing gold paste. resulting in a typical resistance of 100 m $\Omega$cm$^{-2}$. Thermopower measurements were made using the apparatus depicted in FIG. 1. The direction of the dc current flow through the Peltier device 10 was switched using switching means 24, thereby reversing the temperature gradient. The measurements made in each direction of the applied current, $S_+$ and $S_-$, yield an averaged thermopower $S=(S_+-S_{31})/2$. The measurements include some parasitic influence from the thermocouples 12, 14.

Figure 5:
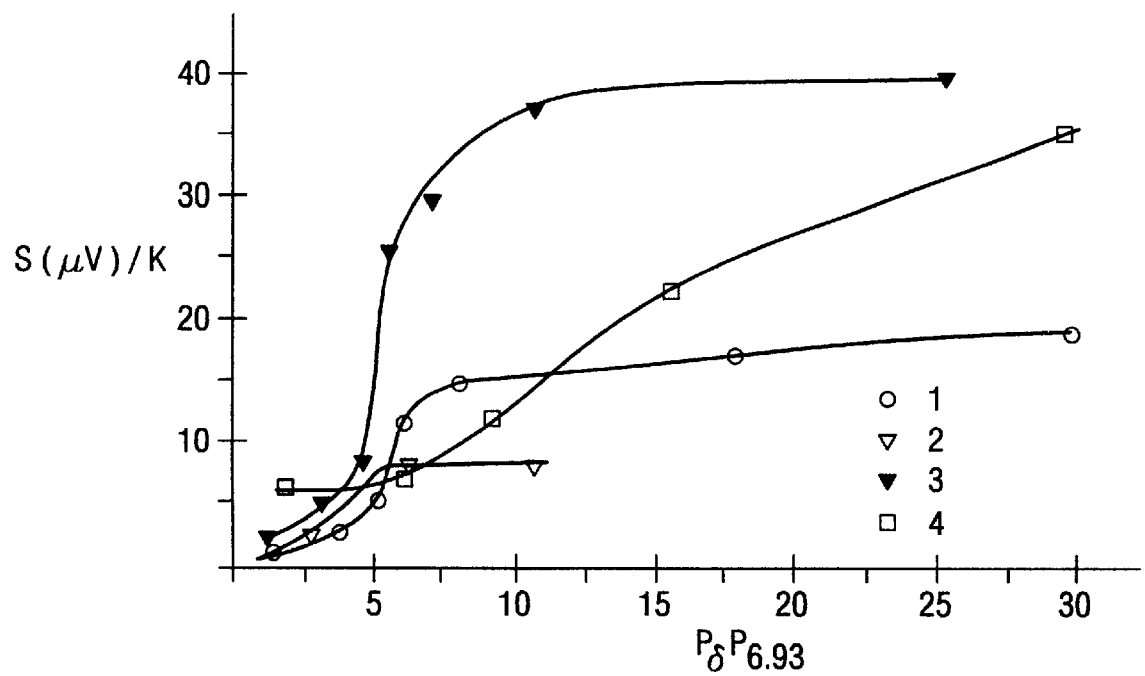
FIG. 5 shows $S/(\mu V)K^{-1}$ against $\rho\delta/\rho_{6.93}$ for a number of thin film samples.

The measurements of thermopower verses $\rho_\delta/\rho_{6.93}$ are shown in FIG. 5, where $\rho_\delta/\rho_{6.93}$ is the ratio of the measured resistivity to the resistivity obtained from the sample having $\delta=0.07$. The legend shown in FIG. 5 relates to the following examples: (1) corresponds to a monocrystalline film with measurements made along the grain length; (2) as (1) but with measurements made perpendicular to the grain length; (3) corresponds to the texturised film; and (4) corresponds to the polycrystalline film.

FIG. 5 demonstrates that there is a significant difference in thermopower when the temperature gradient is parallel to and perpendicular to the monocrystalline film. Even in the parallel case there is a relatively small value of the thermopower. These phenomena can be explained by a 2D layer model, which indicates that grain boundaries determine the thermopower when the temperature gradient is perpendicular to the grain.

Smaller grain size, as occurs with the texturised film, results in an increase in thermopower. There is no thermopower anisotropy with the texturised film surface because the grains are oriented in all directions.

Texturised film gives rise to increased thermopowers, which is due to the smaller grain size compared to the monocrystalline film. The measured resistivities are also higher, this being due to the increase of grain boundary density. However, it should be noted that resistivity is also increased by microcracking. The grain size threshold for microcracking in YBa$_2$Cu$_3$O$_{7-\delta}$ is estimated to be of the order of 1 μm.

EXAMPLE 3

A bulk YBa$_2$Cu$_3$O$_{7-\delta}$ ceramic was prepared using ultrasonic treatment at 30 kHz on granulated powder followed by uniaxial pressing into a pellet. The final value of δ was ca. 0.6. X-ray reflection spectroscopy and SEM of sections taken perpendicular and parallel to the press axis indicate a prevalence of (ab) plane layered grains. This is desirable because thermopower is highly anistropic, with $S_c>>S_{ab}$. The prepared sample exhibited a thermopower S of 130 μVK$^{-1}$ and resistivity ρ of $4\times10^{-3}$ $\Omega$cm, giving a partial figure of merit Z* (as previously defined) of 4225000 (μV)$^2$ $\Omega^{-1}$ cm$^{-1}$ K$^{-2}$.

The typical grain size in the sample was 5 to 30 μm. Further improvements are to be anticipated if smaller grains are employed, firstly due to the microcracking phenomena described above, and secondly because, in the bulk, three dimensional, case electroconductivity increases as grain size decreases. Smaller grains may be prepared by mechanical means, i.e. grinding, or by a cryogenic liquid phase preparation of the oxide.

| Group | Physical Parameter (ρ/Ω cm$_3$) S/μVK$^{-2}$ Z* (μV)$^2\Omega^{-1}$cm$^{-1}$K$^{-2}$ | Cooling Method | | |
|---|---|---|---|---|
| | | Furnace | Quenching on alumina plate | Quenching on copper plate | Quenching in liquid nitrogen |
| "A" | | | | | |
| EuBa$_2$Cu$_3$O$_{3-4}$ | ρ | $5\times10^{-3}$ | 0.26 | 0.42 | 0.6 |
| | S | 14 | 110 | 143 | 150 |
| | Z* | 39200 | 46500 | 48700 | 37500 |
| SmBa$_2$Cu$_3$O$_{7-\delta}$ | ρ | $4.1\times10^{-3}$ | 0.32 | 0.4 | 1.1 |
| | S | 14 | 117 | 147 | 150 |
| | Z* | 47800 | 42800 | 54000 | 20500 |
| "B" | | | | | |
| EuBa$_2$Cu$_3$O$_{7-\delta}$ | ρ | $1.3\times10^{-3}$ | 0.125 | 0.135 | $5\times10^{-2}$ |
| | S | 11 | 220 | 255 | 210 |
| | Z* | 93100 | 387200 | 481700 | 882000 |
| SmBa$_2$Cu$_3$O$_{7-\delta}$ | ρ | $1.7\times10^{-3}$ | 0.1 | 0.1 | 0.115 |
| | S | 11 | 220 | 220 | 227 |
| | Z* | 71200 | 484000 | 484000 | 448100 |
| "C" | | | | | |
| EuBa$_2$Cu$_3$O$_{7-\delta}$ | ρ | $1.45\times10^{-4}$ | $7.5\times10^{-3}$ | $1.75\times10^{-3}$ | $1.8\times10^{-2}$ |
| | S | 10 | 110 | 115 | 130 |
| | Z* | 689700 | 1613000 | 755700 | 938900 |
| SmBa$_2$Cu$_3$O$_{7-\delta}$ | ρ | $0.8\times10^{-3}$ | $1.8\times10^{-2}$ | $1.8\times10^{-2}$ | $3\times10^{-2}$ |
| | S | 10 | 130 | 170 | 200 |
| | Z* | 125000 | 938900 | 1606000 | 1333000 |

What is claimed is:

1. A thermoelectric composition described by the formula:

$$(R Ba_2Cu_3O_{7-\delta})_x + (PrBa_2Cu_3O_{7-\delta})_{1-x}$$

wherein:

R is selected from the group consisting of Y, Ce, Nd, Pm, Sm, Eu, Gd, Tb, Dy, Ho, Er, Tm, Yb, and Lu;

$0 < x < 0.4$; and $\delta$ is a value wherein $(RBa_2Cu_3O_{7-\delta})$ is in a metallic phase.

2. The thermoelectric composition according to claim 1, wherein $0.10 \leq x \leq 0.25$.

3. The thermoelectric composition according to claim 1, wherein the composition includes granules of $RBa_2Cu_3O_{7-\delta}$ and granules of $PrBa_2Cu_3O_{7-\delta}$.

4. The thermoelectric composition according to claim 3, wherein the composition is formed from granules ranging in size from between 0.1 and 100 $\mu$m.

5. The thermoelectric composition according to claim 3, wherein the composition is formed from granules ranging in size from between 0.1 and 30 $\mu$m.

6. The thermoelectric composition according to claim 3, wherein the composition is formed from granules ranging in size from between 0.1 and 2 $\mu$m.

7. The thermoelectric composition according to claim 3, wherein the $RBa_2Cu_3O_{7-\delta}$ and $PrBa_2Cu_3O_{7-\delta}$ are non-homogeneously distributed within the composition.

8. A thermoelectric composition described by the formula:

$$(R Ba_2Cu_3O_{7-\delta})_x + (PrBa_2Cu_3O_{7-\delta})_{1-x}$$

wherein:

R is selected from the group consisting of Y, Ce, Nd, Pm, Sm, Eu, Gd, Tb, Dy, Ho, Er, Tm, Yb, and Lu;

$0 < x < 1$; and the $RBa_2Cu_3O_{7-\delta}$ and $PrBa_2Cu_3O_{7-\delta}$ are non-homogeneously distributed within the composition.

9. The thermoelectric composition according to claim 8, wherein the composition is a composite of granules of $RBa_2Cu_3O_{7-\delta}$ and granules of $PrBa_2Cu_3O_{7-\delta}$.

10. The thermoelectric composition according to claim 8, wherein the composition is formed from granules ranging in size from between 0.1 and 100 $\mu$m.

11. The thermoelectric composition according to claim 8, wherein the composition is formed from granules ranging in size from between 0.1 and 30 $\mu$m.

12. The thermoelectric composition according to claim 8, wherein the composition is formed from granules ranging in size from between 0.1 and 2 $\mu$m.

* * * * *